(12) United States Patent
Shindou

(10) Patent No.: US 8,883,635 B2
(45) Date of Patent: Nov. 11, 2014

(54) SEMICONDUCTOR DEVICE MANUFACTURING METHOD AND SEMICONDUCTOR DEVICE MANUFACTURING APPARATUS

(75) Inventor: Masanori Shindou, Saitama (JP)

(73) Assignee: LAPIS Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/555,969

(22) Filed: Jul. 23, 2012

(65) Prior Publication Data

US 2013/0023117 A1    Jan. 24, 2013

(30) Foreign Application Priority Data

Jul. 22, 2011 (JP) ................................. 2011-161299

(51) Int. Cl.
| | |
|---|---|
| *H01L 21/283* | (2006.01) |
| *G03F 7/16* | (2006.01) |
| *G03F 7/11* | (2006.01) |
| *G03F 7/09* | (2006.01) |
| *H01L 21/67* | (2006.01) |

(52) U.S. Cl.
CPC ............ *H01L 21/6175* (2013.01); *G03F 7/168* (2013.01); *G03F 7/11* (2013.01); *G03F 7/091* (2013.01); *G03F 7/162* (2013.01); *H01L 21/6708* (2013.01)

USPC .......................................................... 438/669

(58) Field of Classification Search
USPC ................... 438/669.43, 597, 670, 671, 672; 430/319
See application file for complete search history.

(56) References Cited

U.S. PATENT DOCUMENTS

| | | | | |
|---|---|---|---|---|
| 7,608,846 | B2 * | 10/2009 | Nakano | 250/504 R |
| 8,183,502 | B2 * | 5/2012 | Asakura et al. | 219/438 |
| 2004/0253802 | A1 * | 12/2004 | Yamano | 438/612 |
| 2009/0186190 | A1 * | 7/2009 | Guan et al. | 428/137 |
| 2010/0051934 | A1 * | 3/2010 | Choung et al. | 257/43 |

FOREIGN PATENT DOCUMENTS

JP    2005-005462 A    1/2005

* cited by examiner

*Primary Examiner* — Zandra Smith
*Assistant Examiner* — Damain A Hillman
(74) *Attorney, Agent, or Firm* — Studebaker & Brackett PC

(57) ABSTRACT

A method of manufacturing a semiconductor device includes: preparing a wafer member, the wafer member including a wafer, a conductive layer formed on a surface of the wafer and a negative photoresist formed on the conductive layer; applying a light blocking material so as to cover at least a part of an outer edge of the wafer member from an upper surface of the negative photoresist to a side surface of the negative photoresist; exposing the negative photoresist to exposure light; removing the light blocking material; and developing the negative photoresist.

13 Claims, 10 Drawing Sheets

SEMICONDUCTOR DEVICE MANUFACTURING METHOD AND SEMICONDUCTOR DEVICE MANUFACTURING APPARATUS

BACKGROUND OF THE INVENTION

1. Field of the Invention

The present invention relates to a semiconductor device manufacturing method and a semiconductor device manufacturing apparatus capable of improving yield rate in manufacturing semiconductor devices.

2. Description of the Related Art

A method of forming a plating electrode on a wafer is described in Japanese Patent Kokai Publication No. 2005-5462 (Patent Document 1), for example. The plating electrode forming method of Patent Document 1 is schematically illustrated in FIG. 1. First, a conductive layer 110 and a negative photoresist 120 are formed in this order on an entire surface of a wafer 100, and then a light blocking part 130 is formed on the negative photoresist 120 near an outer edge of the wafer 100. Next, the negative photoresist 120 is exposed to light through a reticle pattern in which a predetermined pattern is formed. Finally, the light blocking part 130 is removed and then a developing process is performed. Thus, a desired pattern according to the reticle pattern is formed in the negative photoresist 120, and a desired plating electrode is formed by exposing a part of the conductive layer 110 which is disposed under a position where the light blocking part 130 on the negative photoresist was formed.

In the invention described in the Patent Document 1, the light blocking part 130 is formed by ink printing on the negative photoresist 120 disposed on the outer edge of the wafer 100, as described above. However, in this configuration, when the negative photoresist 120 is exposed to exposure light, the exposure light may reach an undesirable position of the negative photoresist 120 which is covered by the light blocking part 130, through a side surface of the negative photoresist 120. Since the negative photoresist has characteristics that a part illuminated with the exposure light becomes insoluble or hardly soluble in a developer, it is difficult to make the conductive layer 110 be exposed according to an intended pattern after the negative photoresist 120 was developed and therefore it is difficult to form a desired plating electrode.

As well as in the plating electrode forming method, in a semiconductor device manufacturing method including a process of forming a light blocking part for preventing a negative photoresist disposed on a conductive layer near an outer edge of a wafer from being illuminated with exposure light, when a predetermined pattern is formed by exposing to light and developing the negative photoresist disposed on the conductive layer near the outer edge of the wafer, there is a problem that the exposure light undesirably reaches a part of the negative photoresist from the side surface of the negative photoresist 120.

SUMMARY OF THE INVENTION

It is an object of the present invention to provide a semiconductor device manufacturing method capable of improving yield rate in manufacturing semiconductor devices, and a semiconductor device manufacturing apparatus capable of improving yield rate in manufacturing semiconductor devices.

According to an aspect of the present invention, a method of manufacturing a semiconductor device includes: preparing a wafer member, the wafer member including a wafer, a conductive layer formed on a surface of the wafer and a negative photoresist formed on the conductive layer; applying a light blocking material so as to cover at least a part of an outer edge of the wafer member from an upper surface of the negative photoresist to a side surface of the negative photoresist; exposing the negative photoresist to exposure light; removing the light blocking material; and developing the negative photoresist.

According to another aspect of the present invention, a semiconductor device manufacturing apparatus includes: a wafer mount table unit having a mount plate on which a wafer member is placed, a first line being a longest line passing through a center of mass on the mount plate and each connecting two ends of the mount plate, the first line being shorter than a diameter of the wafer member to be placed on the mount plate; and a light-blocking-material supplier for applying a light blocking material so as to cover at least a part of an outer edge of the wafer member from an upper surface of the wafer member to a side surface of the wafer member.

DETAILED DESCRIPTION OF THE INVENTION

Figure 1:
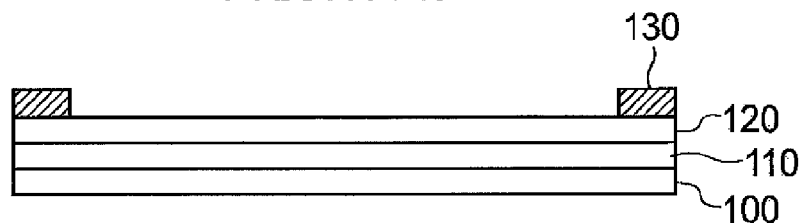
FIG. 1 is a cross-sectional view schematically illustrating a process in a conventional plating electrode forming method.

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

Semiconductor device manufacturing apparatuses and a semiconductor device manufacturing methods according to the present invention will be explained below in detail, referring to the drawings.

First Embodiment

Figure 2:
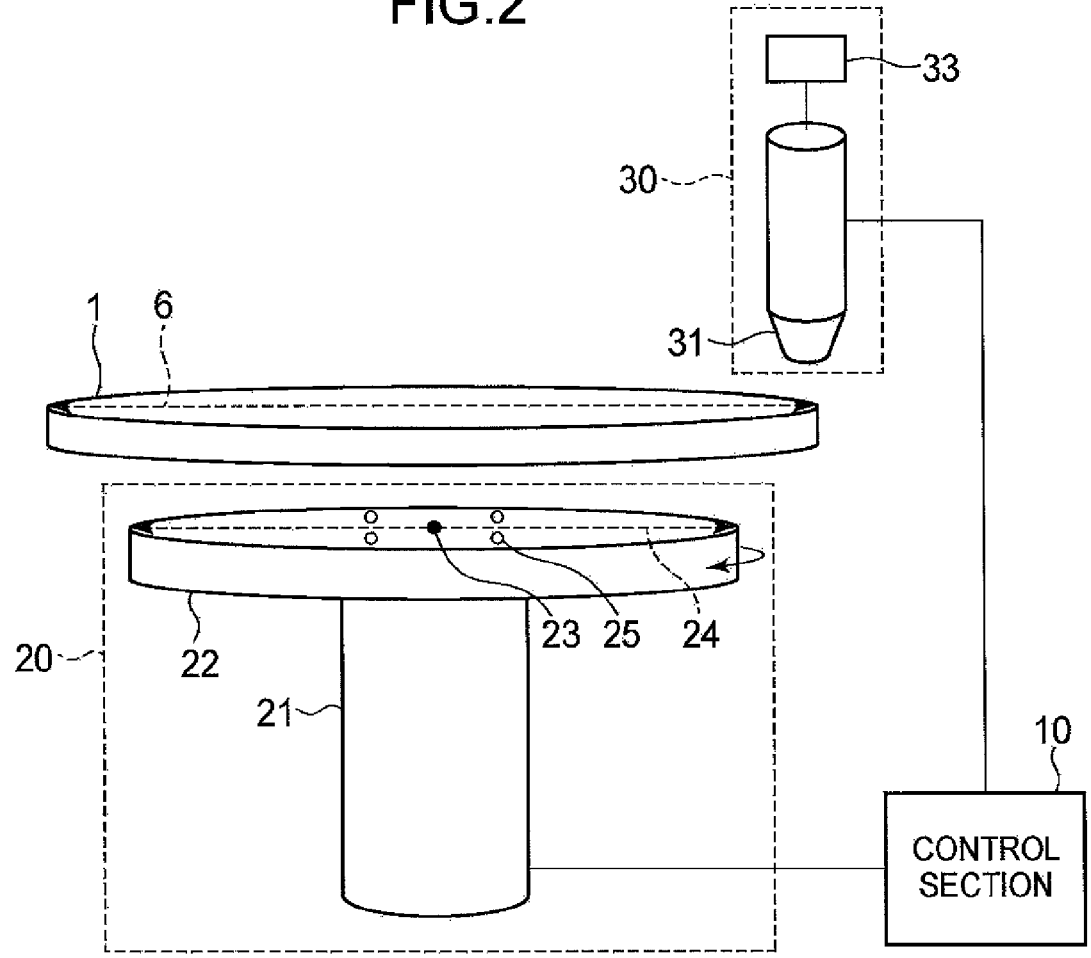
FIG. 2 is a perspective view schematically illustrating a semiconductor device manufacturing apparatus according to a first embodiment of the present invention.

FIG. 2 is a perspective view schematically illustrating a semiconductor device manufacturing apparatus according to a first embodiment of the present invention.

The semiconductor device manufacturing apparatus according to the first embodiment includes a wafer mount table unit 20 having a mount plate 22 on which a wafer member 5 is placed. A first line 24 represented by a dotted arrow on the mount plate 22 is a longest line among lines passing through a center of mass 23 of the mount plate 22 on a surface of the mount plate 22 and each connecting two ends of the mount plate 22. The first line 24 is shorter than a diameter (i.e., a second line 6 represented by a dotted arrow) of the wafer 1 (or the wafer member 5) which is placed on the mount plate 22. Although the wafer 1 (or the wafer member 5) is not a part of the semiconductor device manufacturing apparatus according to the present invention, it is illustrated in FIG. 2 for convenience of explanation.

Referring to FIG. 2, the semiconductor device manufacturing apparatus according to the first embodiment includes a control section 10, the wafer mount table unit 20 and a light-blocking-material supplier 30. The semiconductor device manufacturing apparatus may be also used as a liquid application apparatus for applying a desired liquid to an outer edge of a circular plate such as a wafer, for example.

The wafer 1 is a wafer used for manufacturing a typical semiconductor device, such as a 6-inch wafer, 8-inch wafer or 12-inch wafer. A diameter of the wafer 1 is represented by a dotted arrow 6. The wafer 1 has a diameter of 150 mm if it is a 6-inch wafer, 200 mm if it is an 8-inch wafer, or 300 mm if it is a 12-inch wafer.

The control section 10 includes a control mechanism for controlling operation of the wafer mount table unit 20 and operation of the light-blocking-material supplier 30. Although the control section 10 is shared by the wafer mount table unit 20 and the light-blocking-material supplier 30 for controlling operation of these elements in the first embodiment, it is not limited to this example. The wafer mount table unit 20 and the light-blocking-material supplier 30 may be independently controlled by separate control sections. Moreover, the control section 10 may control operation of other elements in addition to the wafer mount table unit 20 and the light-blocking-material supplier 30.

The wafer mount table unit 20 includes a support section 21 and the mount plate 22 which is supported on the support section 21. The support section 21 includes a supporting mechanism such as a supporting pole for supporting the mounting plate and a rotating mechanism for rotating the mounting plate 22 in response to control by the control section 10. For example, the support section 21 causes the mount plate 22 to rotate about the center of mass 23 of the mount plate 22 (i.e., a vertical axis passing through the center). The first line 24 represented by the dotted arrow is a longest line among lines passing through the center of mass 23 of the mount plate 22 on a surface of the mount plate 22 and each connecting two ends of the mount plate 22. The first line 24 is shorter than a diameter (i.e., a second line 6) of the wafer 1 (or the wafer member 5). It is preferable that the mount plate 22 have a circular shape. If so, the mount plate 22 is designed to have a diameter shorter than the diameter (i.e., a second line 6) of the wafer 1 (or the wafer member 5) and the mount plate 22 rotates about the center of the mount plate 22. If the semiconductor device manufacturing apparatus treats a 6-inch wafer, it is preferable that the first line 24 have a length of less than 150 mm; if the apparatus treats a 8-inch wafer, it is preferable that the first line 24 have a length of less than 200 mm; and if the apparatus treats a 12-inch wafer, it is preferable that the first line 24 have a length of less than 300 mm. Further, if the semiconductor device manufacturing apparatus treats several types of wafers such as 6-inch wafer, 8-inch wafer and 12-inch wafer, it is preferable that the first line 24 have a length of less than 150 mm. The mount plate 22 has at least one absorbing section 25 for fixing the wafer 1 (or the wafer member 5) to the mount plate 22 by vacuum absorbing, for example. The wafer mount table unit 20 may be configured so that the support section 21 and the mount plate 22 form a single body which rotates together.

The light-blocking-material supplier 30 has a supply vent 31 and supplies a light blocking material through the supply vent 31 in response to control by the control section 10. The light-blocking-material supplier 30 may have a shifting mechanism 33 for shifting light-blocking-material supplier 30 and changing a position to which the light blocking material is applied. The light-blocking-material supplier 30 may be moved by the shifting mechanism 33 to adjust its position in response to control by the control section 10. A dispenser capable of continuously, intermittently or partially supplying a liquid may be used as the light-blocking-material supplier 30. The light blocking material to be supplied may be stored in the light-blocking-material supplier 30 or may be supplied to the light-blocking-material supplier 30 from a light blocking material storage tank or the like (not illustrated in the drawings).

Next, referring to FIG. 2 to FIG. 7, a semiconductor device manufacturing method according to the first embodiment will be explained.

Figure 3:
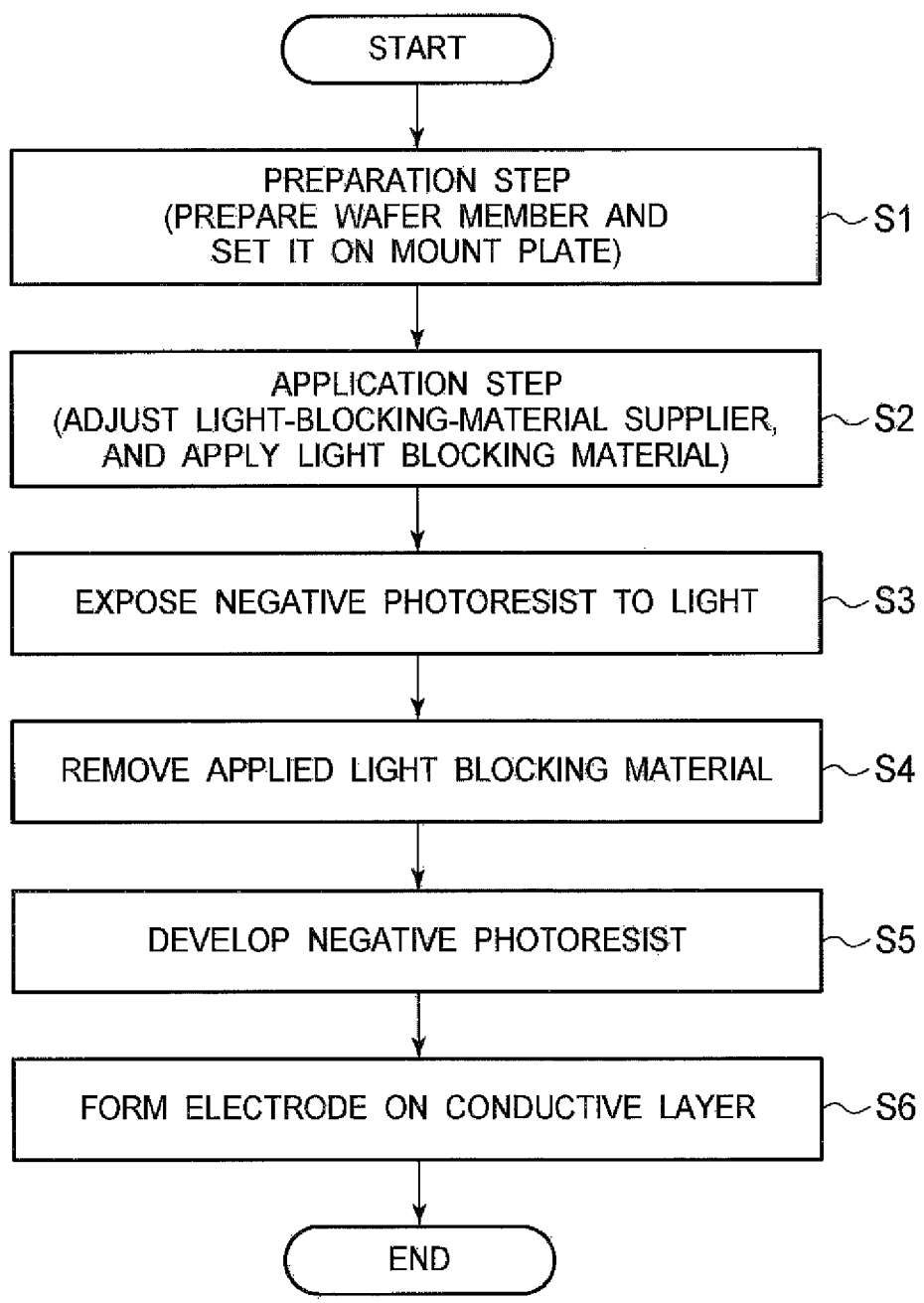
FIG. 3 is a flowchart showing a method of manufacturing a semiconductor device according to the first embodiment.

FIG. 3 is a flowchart showing a method of manufacturing a semiconductor device according to the first embodiment. As shown in FIG. 3, the semiconductor device manufacturing method according to the first embodiment includes the following processes: preparing a wafer member 5 including at least a wafer 1, a conductive layer 2 formed on the surface of the wafer 1 and a negative photoresist 3 formed thereon (step S1); applying the light blocking material 32 so as to cover at least of a part the outer edge of the wafer member 5 from a surface of the negative photoresist 3 to a side surface of the negative photoresist 3 (step S2); exposing the negative photoresist 3 to exposure light (step S3); removing the light blocking material 32 (step S4); and developing the negative photoresist 3 (step S5). The semiconductor device manufacturing method according to the first embodiment may include a process of forming an electrode on a part of the conductive layer by metal plating using another part of the conductive layer formed near the outer edge of the wafer member 5 as a plating electrode (step S6).

Figure 4:
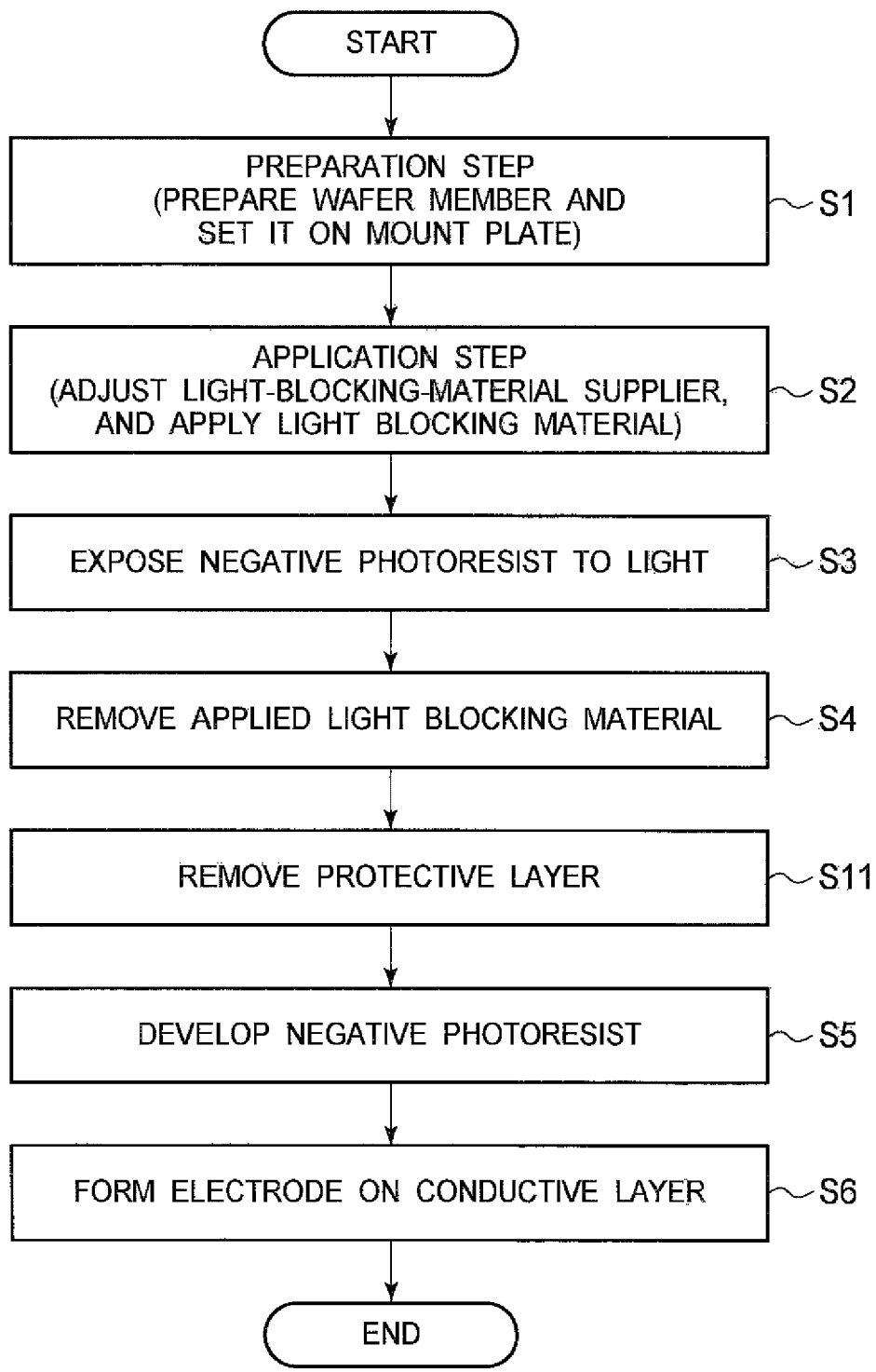
FIG. 4 is a flowchart showing another method of manufacturing a semiconductor device according to the first embodiment.

FIG. 4 is a flowchart showing another method of manufacturing a semiconductor device according to the first embodiment. As shown in FIG. 4, the semiconductor device manufacturing method according to the first embodiment includes the following processes: preparing a wafer member 5 including a wafer 1, a conductive layer 2 formed on the surface of the wafer 1, a negative photoresist 3 formed thereon, and a protective layer formed thereon (step S1); applying the light blocking material 32 so as to cover at least of a part the outer edge of the wafer member 5 from a surface of the protective layer 4 through the side surface of the protective layer 4 to the side surface the negative photoresist 3 (step S2); exposing the negative photoresist 3 to exposure light (step S3); removing the light blocking material 32 (step S4); removing the protective layer (step S11), and developing the negative photoresist 3 (step S5). The semiconductor device manufacturing method according to the first embodiment may include a process of forming an electrode on a part of the conductive layer by metal plating using another part of the conductive layer formed near the outer edge of the wafer member 5 as a plating electrode (step S6).

Figure 5:
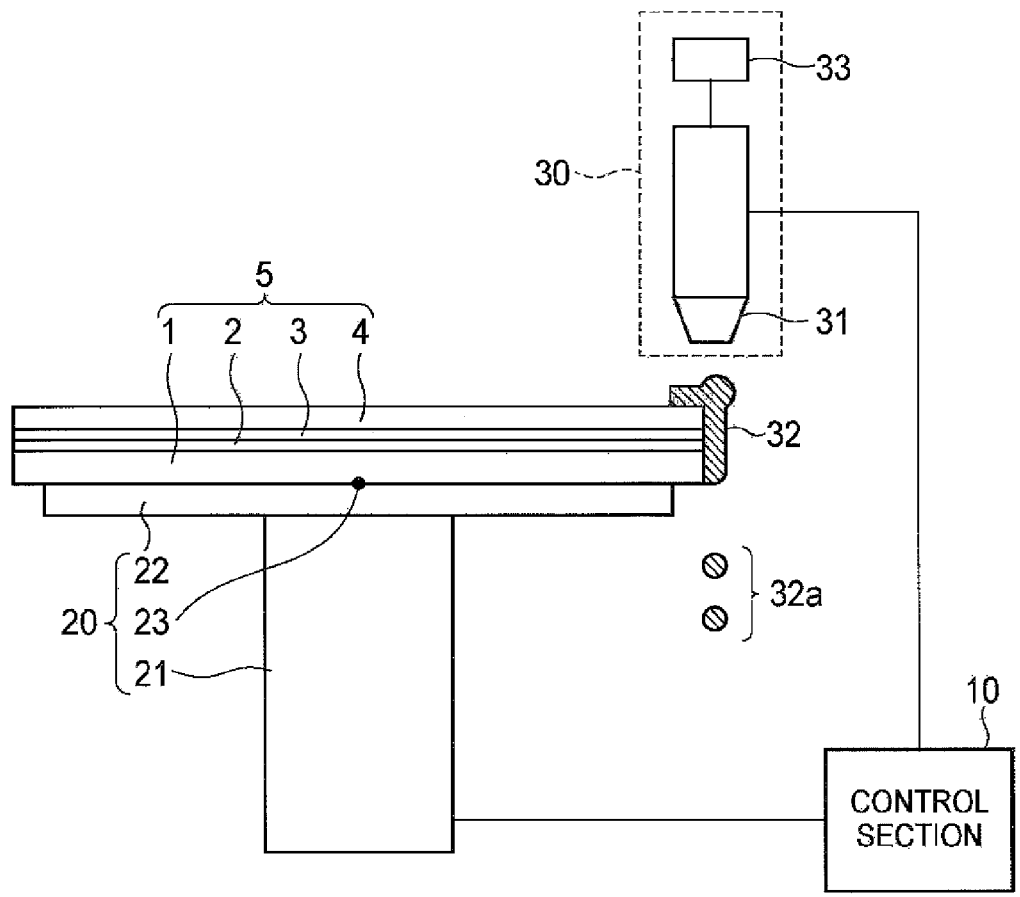
FIG. 5 is a cross-sectional view schematically illustrating a state where a light blocking material is supplied from a light-blocking-material supplier to a wafer member in the first embodiment.
Figure 6A:
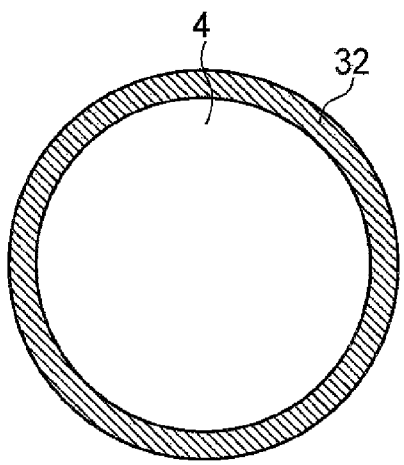
FIGS. 6A and 6B are top views of the wafer members on which the light blocking material is applied, taken from an upper surface side of the wafer.
Figure 6B:
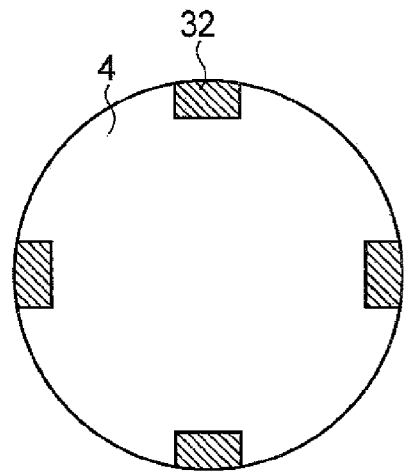
Figure 7:
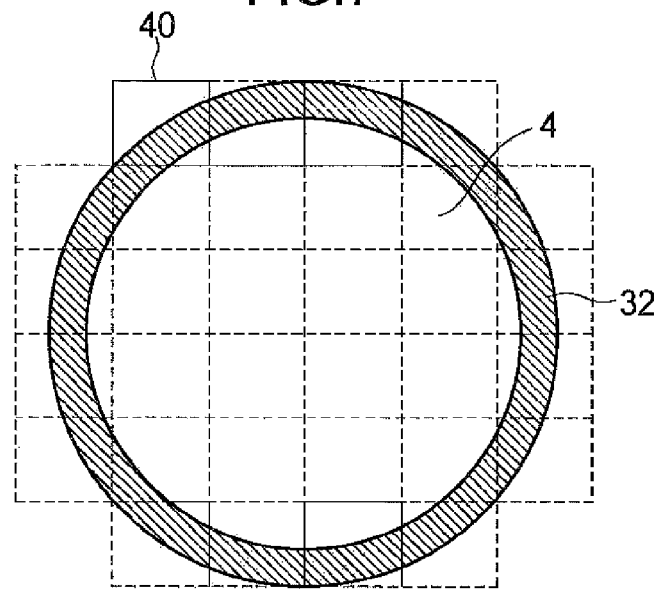
FIG. 7 is a top view schematically illustrating a process of exposing a negative photoresist to light by using a reticle pattern in the first embodiment.

FIG. 5 is a cross-sectional view schematically illustrating a state where a light blocking material 32 is supplied from a light-blocking-material supplier 30 to the wafer member 5. FIGS. 6A and 6B are top views of the wafer members on which the light blocking material 32 was applied, taken from an upper surface side of the wafer member 5. FIG. 7 is a top view schematically illustrating a process of exposing the negative photoresist 3 to light by using a reticle pattern 40. A detailed explanation will follow.

First, the wafer member 5 is placed on the mounting plate 22. The wafer member 5 may be placed on the mounting plate 22 with various well-known and commonly used methods. At this time, the wafer member 5 includes at least the wafer 1, the conductive layer 2 covering the wafer 1 and the negative photoresist 3 covering the conductive layer 2. The wafer member 5 may also include a protective layer 4 covering the negative photoresist 3 and capable of transmitting exposure light. The protective layer 4 is made from polyethylene terephthalate (PET), for example, and protects the negative photoresist 3. For example, the negative photoresist 3 has a thickness of 120 [µm] and the protective layer 4 has a thickness of 22 [µm]. The material of the protective layer 4 is not limited to PET and other various materials may be used. The thickness of the protective layer 4 may be variously selected.

Next, a wafer position adjuster which is not illustrated in the drawing adjusts a position of the wafer member 5 so that a center of the wafer member 5 agrees with the rotation axis of the mounting plate 22. At this time, the wafer member 5 is set so that the outer edge of the wafer member 5 protrudes outward from an outer edge of the mounting plate 22. If the mounting plate 22 has a circular shape, the wafer member 5 is adjusted so that a center of the mounting plate 22 and the center of the wafer member 5 agree with each other and both of the centers are disposed in a vertical line extending in a direction perpendicular to the surface of the mounting plate 22. The wafer position adjuster may be controlled by the control section 10 or another control mechanism. Furthermore, the adjustment of the position of the wafer member 5 may be other wafer position adjusting mechanisms which are well-known and commonly used.

After the adjustment of the position of the wafer member 5 on the mounting plate 22 is finished, the wafer member 5 is absorbed and fixed to the mounting plate 22 by the absorbing section 25 illustrated in FIG. 2.

Next, a position of the light-blocking-material supplier 30 in relation to the wafer member 5 is adjusted by shifting the light-blocking-material supplier 30 in response to control by the control section 10. The light-blocking-material supplier 30 is disposed in a position in relation to the wafer member 5 where the light blocking material supplied from the light-blocking-material supplier 30 is applied from above the wafer member 5 so as to cover at least a part of the wafer member 5 from the upper surface to the side surface of the wafer member 5, strictly speaking, at least a part of the negative photoresist 3 from the upper surface to the side surface of the negative photoresist 3 near the outer edge of the wafer member 5. In the case where the wafer member 5 also includes the protective layer 4 formed on the negative photoresist 3, it is preferable to dispose the light-blocking-material supplier 30 in a position where the light blocking material supplied from the light-blocking-material supplier 30 is applied so as to cover at least a part from an upper surface of the protective layer 4 through a side surface of the protective layer 4 to the side surface of the negative photoresist 3. The light-blocking-material supplier 30 may be disposed in relation to the wafer member 5 in a position determined based on an actual position of the wafer member 5 in the process described above or in a predetermined position determined in consideration of a position of the wafer member 5. If the light-blocking-material supplier 30 is disposed in relation to the wafer member 5 in a position determined based on a position of the wafer member 5 in the process described above, a position of the light-blocking-material supplier 30 may be determined as follows: by checking position information of the wafer member 5 on the mount plate 22 by using a camera or the like not illustrated in the drawing, supplying the position information to the control section 10 and determining the position of the light-blocking-material supplier 30 at the control section 10 based on the supplied position information. By determining a position of the light-blocking-material supplier 30 in relation to the wafer member 5 based on a position of the wafer member 5, the light blocking material 32 is more correctly applied on the wafer member 5 in comparison with the case where the light-blocking-material supplier 30 is disposed in a predetermined position determined in consideration of a position of the wafer member 5.

Next, the light blocking material 32 is supplied from the light-blocking-material supplier 30 and is applied to cover from the upper surface to the side surface of the negative photoresist near the outer edge of the wafer member 5. At this time, as a result of adjusting a position of the light-blocking-material supplier 30, the light blocking material 32 supplied from the light-blocking-material supplier 30 is applied so as to cover at least a part of the wafer member 5 from the upper surface to the side surface of the wafer member 5 near the outer edge of the wafer member 5, in other words, at least a part of the negative photoresist 3 from the upper surface to the side surface of the negative photoresist 3 near the outer edge of the wafer member 5.

In the case where the wafer member 5 also includes the protective layer 4, the light blocking material 32 supplied from the light-blocking-material supplier 30 is applied so as to cover at least a part of the wafer member 5 from the upper surface of the protective layer 4 through the side surface of the protective layer 4 to the side surface of the negative photoresist 3.

Various materials may be used as the light blocking material 32 as long as it has a band gap to absorb ultraviolet light of G-line, H-line and I-line used for exposure light, i.e., a wavelength range of 365 nm to 436 nm and it may contain carbon black, for example. As to a viscosity of the light blocking material 32, any material may be used, if it is not closely adhered to the side surface of the wafer member 5 when applied thereon. It is preferable that the light blocking material 32 have a viscosity of 5 to 100 [mPa·s], for example.

As a result of controlling the support section 21 by the control section 10, the support section 21 rotates the mount plate 22 and accordingly the wafer member 5 which is fixed to the mount plate 22 through the absorbing section 25 rotates. During the rotation of the wafer member 5, if the light blocking material 32 is continuously supplied from the light-blocking-material supplier 30, the light blocking material 32 is continuously formed along the outer edge of the wafer member 5 (as shown in FIG. 6A) from the upper surface to the side surface of the negative photoresist 3. If the light blocking material 32 is intermittently supplied from the light-blocking-material supplier 30, the light blocking material 32 is discontinuously formed along the outer edge of the wafer member 5 (as shown in FIG. 6B) from the upper surface to the side surface of the negative photoresist 3. Although the supplied blocking material 32 applied on the side surface of the wafer member 5 flows downward, it should drip down in a ground direction along the side surface of the wafer member 5. Therefore, there is little likelihood that the light blocking material 32 undesirably reaches a back (lower) surface of the wafer member 5.

After the light blocking material 32 is applied on the wafer member 5, the light blocking material 32 is hardened. The light blocking material 32 may be made from a material which is capable of being naturally dried and needs no heat treatment or the like. If such a material is used as the light blocking material 32, the hardening process may be omitted and so reduction of manufacturing cost is possible.

FIG. 6A illustrates the wafer member 5 when the light blocking material 32 is continuously applied on the outer edge of the wafer member 5; and FIG. 6B illustrates the wafer member 5 when the light blocking material 32 is intermittently applied on the outer edge of the wafer member 5. The light blocking material 32 is not limited to the examples illustrated in FIGS. 6A and 6B. The light blocking material 32 may be applied in various manners, if at least one part of the negative photoresist 3 from the upper surface to the side surface of the negative photoresist 3 on the outer edge of the wafer member 5 is covered by the light blocking material 32.

FIG. 7 is a top view schematically illustrating the process of exposing the negative photoresist 3 by using the reticle pattern 40. In the first embodiment, an example where the negative photoresist 3 is exposed to light by a stepper will be explained. However, it is not always necessary to use the reticle pattern 40 for exposing the negative photoresist 3 to light when the present invention is carried out.

First, the reticle pattern 40 is disposed above the negative photoresist 3. The reticle pattern 40 is a rectangular reticle pattern, for example. The reticle pattern 40 has a predetermined pattern which is not illustrated in the drawing. Above the reticle pattern 40, an exposure-light emitting part of the stepper which is not illustrated in the drawing is disposed. Then, the negative photoresist 3 is illuminated with exposure light which is emitted from the exposure-light emitting part of the stepper through the reticle pattern 40, and the predetermined pattern is projected onto the negative photoresist 3 thereby. In general, the projecting process is performed a plurality of times. Due to characteristics of a negative photoresist, a part of the negative photoresist illuminated with the exposure light is not or hardly soluble in a developer, and the other part of the negative photoresist not illuminated with the exposure light is soluble in the developer. For this reason, the reticle pattern 40 is formed so that a part of the negative photoresist which is desired to be removed after the developing process is not illuminated with the exposure light. As a result, both of a predetermined part of the negative photoresist 3 where the exposure light is blocked according to the reticle pattern 40 and another predetermined part of the negative photoresist 3 where the exposure light is blocked by the light blocking material 32 become soluble in the developer.

An exposure is performed by the stepper for each of areas represented by dotted lines in FIG. 7. The areas forming a grating-like pattern as illustrated correspond to the reticle pattern 40. The stepper exposes the areas represented by the dotted lines in FIG. 7 one by one through the reticle pattern 40 and the predetermined pattern is projected onto the negative photoresist 3 thereby. The stepper exposes defined areas on the negative photoresist 3 one by one through the reticle pattern 40 as described above. When another pattern is formed on the negative photoresist 3 without using the reticle pattern 40, in addition to the predetermined pattern projected onto the negative photoresist 3, in order to form a plating electrode on the outer edge of the wafer member 5, it is sometimes necessary to form a pattern which is not the reticle pattern 40 before the exposing process. The application of the light blocking material 32 on the outer edge of the wafer member 5 in the first embodiment of the present invention may be also applied to such a case, for example. However, the present invention is not limited to this case and may be widely applied to cases where it is necessary to apply the light blocking material 32 on the outer edge of the wafer member 5.

After the light exposure of the negative photoresist 3, the light blocking material 32 is removed. The removal of the light blocking material 32 is performed by using, for example, ethanol, acetone, isopropyl alcohol or the like.

In the case where the wafer member 5 also includes the protective layer 4 formed on the negative photoresist 3, when the protective layer 4 is detached from the negative photoresist 3, the light blocking material 32 is concurrently detached from the negative photoresist 3. The reason is as follows: in the case where the wafer member 5 also includes the protective layer 4 formed on the negative photoresist 3, the light blocking material 32 applied on the surface of the protective layer 4 covers from the upper surface of the protective layer 4 to the side surface of the wafer member 5 so as to form a single body, and so the light blocking material 32 may be removed together at a time of removing the protective layer 4 from the negative photoresist 3. Even if the protective layer 4 is formed on the negative photoresist 3, reliability of removing the light blocking material 32 can be improved by using ethanol or the like as described above to remove the light blocking material 32.

After the light blocking material 32 is removed, the negative photoresist 3 is developed. Various commonly-used developers may be used as the developer for developing the negative photoresist 3, and for example, an acrylic solution such as an aqueous solution of sodium hydrogen carbonate having concentration of about 1% may be used. As a result of developing the negative photoresist 3, a part of the conductive layer 2 is exposed according to a predetermined pattern projected onto the negative photoresist 3 through the reticle pattern 40 in the exposing process, and another part of the conductive layer 2 is exposed according to a shading pattern for partially shading by using the light blocking material 32.

After the negative photoresist 3 is developed, an electrode may be formed by coating part of the conductive layer 2 which is exposed according to the predetermined pattern projected onto the negative photoresist 3 through the reticle pattern 40, while another part of the conductive layer 2 exposed according to the light blocking material 32 is used as a plating electrode, for example.

As described above, the semiconductor device manufacturing method according to the first embodiment includes applying the light blocking material 32 so as to cover from the upper surface to the side surface of the negative photoresist 3. Thus, when the predetermined pattern is formed by exposing and developing the negative photoresist 3 on the outer edge of the wafer member 5, it is possible to prevent the exposure light from reaching the negative photoresist 3 disposed on the outer edge of the wafer member 5 from the side surface of the wafer member 5. Therefore, it is possible to improve yield rate in manufacturing semiconductor devices.

In the case of patent document 1, if a protective layer is formed on the negative photoresist, the light blocking part is formed only on the protective layer, exposure light accordingly reaches the negative photoresist covered by the light blocking part through a side surface of the protective layer, and therefore there is a more remarkable problem. Whereas in the first embodiment of the present invention, the light blocking material 32 is applied so as to cover at least a part from the upper surface of the protective layer 4 on the negative photoresist 3 through the side surface of the protective layer 4 to the side surface of the negative photoresist 3. Therefore, according to the first embodiment, even if the protective layer 4 is formed on the negative photoresist 3, the exposure light does not reach the negative photoresist 3 from the side surface of the wafer member 5 in the process of exposing the negative photoresist 3.

In the semiconductor device manufacturing apparatus according to the first embodiment, the first line 24 represented on the mount plate 22 by the dotted arrow which is a longest line among lines passing through the center of mass 23 of the mount plate 22 and each connecting two ends of the mount plate 22, is shorter than a diameter (i.e., a second line 6) of the wafer member 5 which is placed on the mount plate 22. Thus, even if the wafer member 5 is placed on the mount plate 22 so that the outer edge of the wafer member 5 protrudes outward from the mount plate 22 and the process of applying the light blocking material 32 so as to cover from the upper surface to the side surface of the negative photoresist 3 is performed, some of the applied light blocking material 32 drips down along the side surface of the wafer member 5 in the ground direction and the dripping light blocking material 32 does not reach the back surface of the wafer member 5. Thus, it is possible to reduce probability of a problem expected when the light blocking material 32 reaches the back surface of the wafer member 5 and the wafer member 5 is mounted on the mount plate for an exposure device, i.e., probability that the exposure light is not focused on the negative photoresist in the succeeding exposing process. Therefore, it is possible to improve yield rate in manufacturing semiconductor devices according to the semiconductor device manufacturing method of the first embodiment.

Second Embodiment

Figure 8:
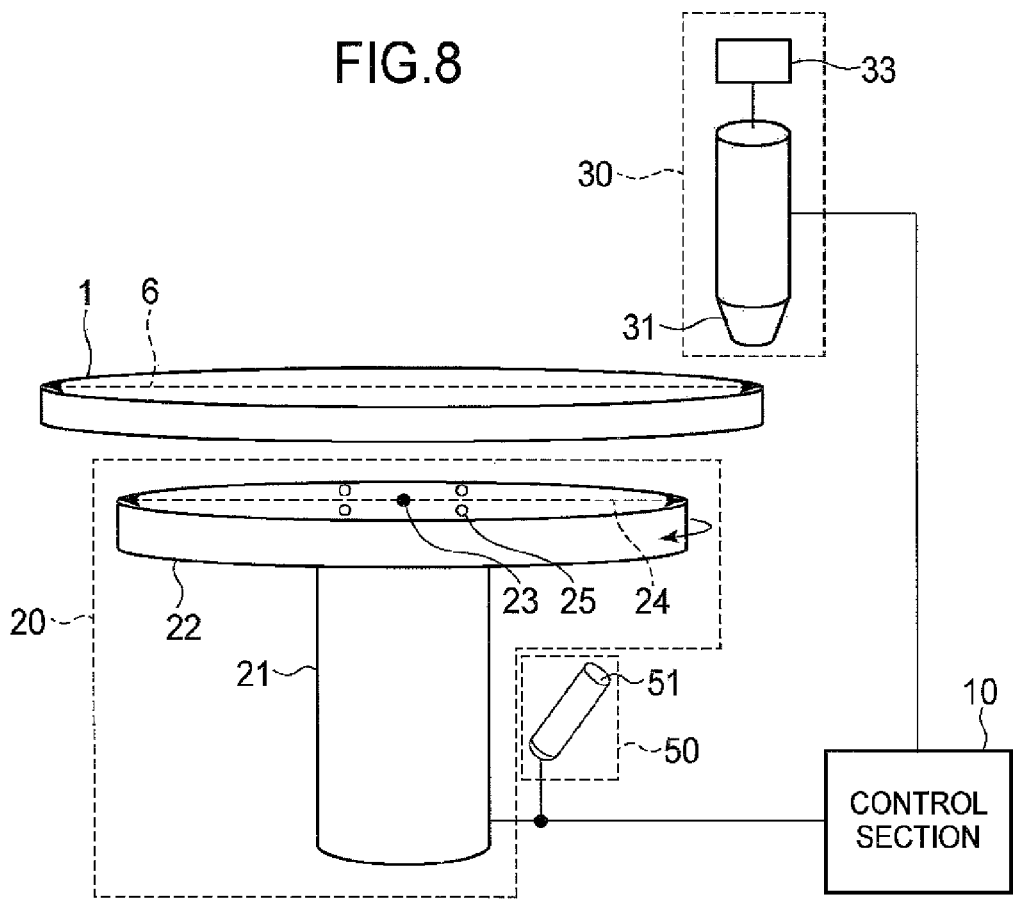
FIG. 8 is a perspective view schematically illustrating a semiconductor device manufacturing apparatus according to a second embodiment of the present invention.

FIG. 8 is a perspective view schematically illustrating a semiconductor device manufacturing apparatus according to a second embodiment of the present invention.

The semiconductor device manufacturing apparatus according to the second embodiment includes a wafer mount table unit 20 having a mount plate 22 on which a wafer member 5 is placed. A first line 24 represented by a dotted arrow on the mount plate 22 is a longest line among lines passing through a center of mass 23 of the mount plate 22 on a surface of the mount plate 22 and each connecting two ends of the mount plate 22. The first line 24 is shorter than a diameter (i.e., a second line 6 represented by a dotted arrow) of the wafer 1 (or the wafer member 5) which is placed on the mount plate 22. The semiconductor device manufacturing apparatus further includes an air blower 50 for blowing air in a direction from a center side to an edge side of the mount plate 22. Elements in the second embodiment that are the same or substantially the same as those in the first embodiment are assigned the same reference characters.

The air blower 50 has an air vent 51 for blowing air. The air blower 50 blows air through the air vent 51 in a direction from the center side to the edge side of the mount plate 22. The air blower 50 is driven by the control section 10. An air direction and an air pressure of air emitted from the air vent 51 are adjusted by the control section 10, for example. If the air blower 50 is not configured to be moved by the control section 10, the air vent 51 is disposed closer to the support pole of the support section 21 than the edge part of the mount plate 22 and below the mount plate 22 so as to blow air from below the mount plate 22 in the direction from the center side to the edge side of the mount plate 22. Moreover, if neither the air blower 50 nor the light-blocking-material supplier 30 is configured to be driven by the control section 10, the air vent 51 is disposed so as to blow air through the air vent 51 toward the light-blocking-material supplier 30.

Figure 9:
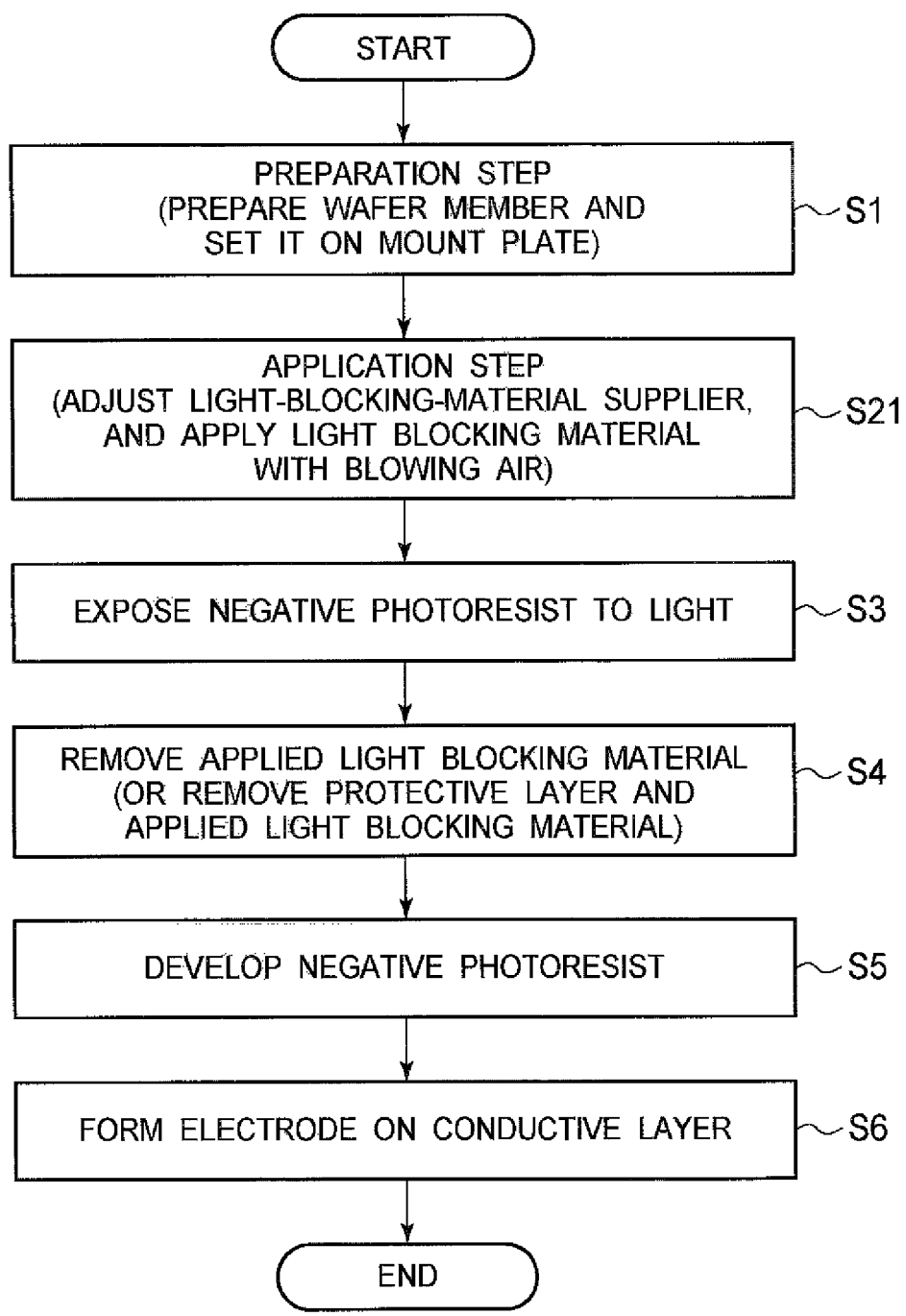
FIG. 9 is a flowchart showing a method of manufacturing a semiconductor device according to the second embodiment.

Next, referring to FIG. 9 and FIG. 10, a semiconductor device manufacturing method according to the second embodiment will be explained. FIG. 9 is a flowchart showing a method of manufacturing a semiconductor device according to the second embodiment.

The semiconductor device manufacturing method according to the second embodiment is carried out by using the semiconductor device manufacturing apparatus which includes the wafer mount table unit 20 having the mount plate 22 on which the wafer member 5 is placed. A first line 24 represented by the dotted line on the mount plate 22 is a longest line among lines passing through the center of mass 23 on the mount plate 22 and each connecting two ends of the mount plate. The first line 24 is shorter than a diameter (i.e., a second line 6) of the wafer member 5 which is mounted on the mount plate 22.

The semiconductor device manufacturing method according to the second embodiment includes the following processes: preparing the wafer member 5 as the wafer member in which the conductive layer 2 is formed on the surface of the wafer 1 and then the negative photoresist 3 is formed thereon (step S1); mounting the wafer member 5 on the mount plate 22 so that the outer edge of the wafer member 5 protrudes outward from the edge part of the mount plate 22 (step S1); applying the light blocking material 32 so as to cover at least a part from the upper surface to the side surface of the negative photoresist 3 near the outer edge of the wafer member 5 (step S21); exposing the negative photoresist 3 to light (step S3); removing the light blocking material 32 (step S4); and developing the negative photoresist 3 (step S5). In the process of applying the light blocking material 32 on the wafer member 5, air which flows from the center side to the edge side of the mount plate 22 is blown from below the wafer member 5 to the outer edge of the wafer member 5 on which the light blocking material 32 is applied (step S21). The semiconductor device manufacturing method according to the second embodiment may include a process of forming an electrode on a part of the conductive layer by metal plating using another part of the conductive layer formed near the outer edge of the wafer member 5 as a plating electrode (step S6).

Figure 10:
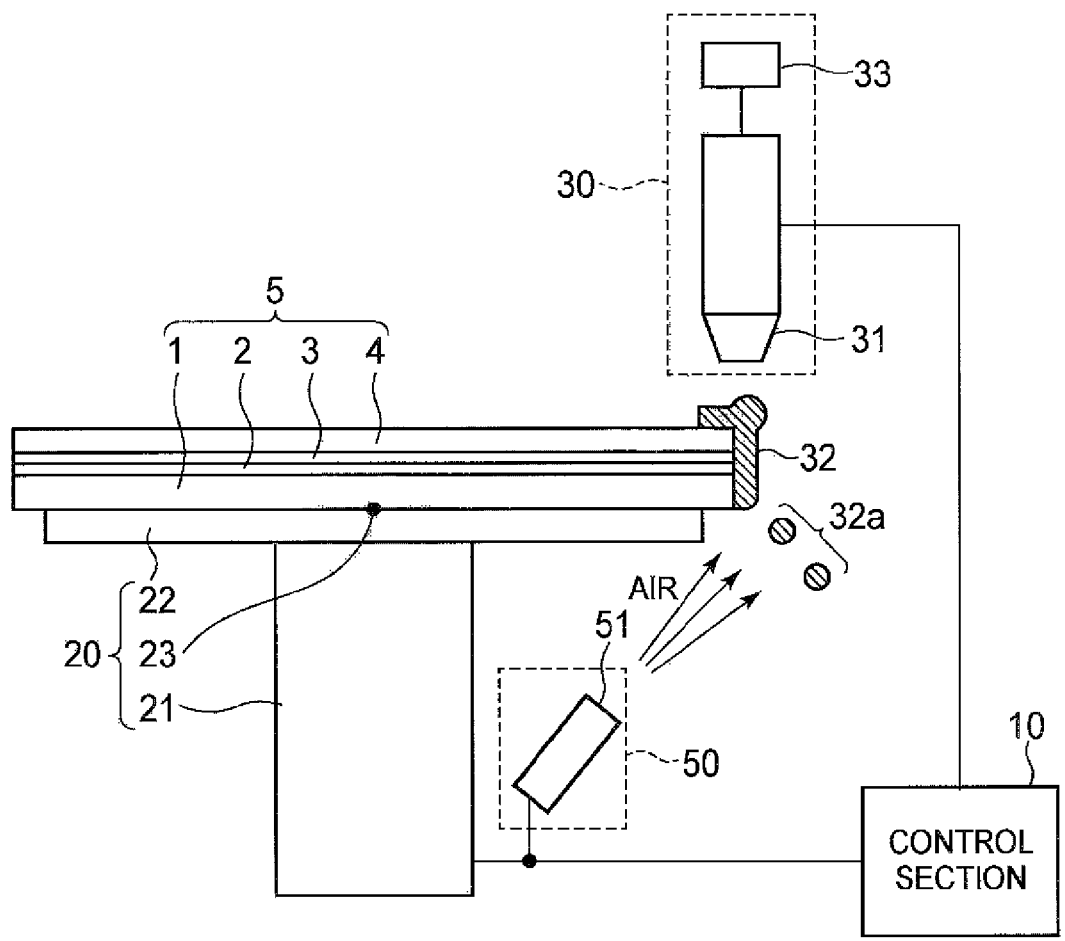
FIG. 10 is a cross-sectional view schematically illustrating a state where a light blocking material is supplied from a light-blocking-material supplier to a wafer member and air is blown from an air blower disposed below the wafer member to an outer edge of the wafer member in the second embodiment.

FIG. 10 is a cross-sectional view schematically illustrating a state where a light blocking material 32 is supplied from a light-blocking-material supplier 30 to the wafer member 5 and air is blown from the air blower 50 disposed below the wafer member 5 to an outer edge of the wafer member in the second embodiment.

First, like the semiconductor device manufacturing method according to the second embodiment, the wafer member 5 is placed on the mount plate 22, a position of the wafer member 5 is adjusted, and the wafer member 5 is fixed to the mount plate 22 by adsorbing, for example. The light-blocking-material supplier 30 may have a shifting mechanism 33 for shifting light-blocking-material supplier 30 and changing a position to which the light blocking material is applied. The light-blocking-material supplier 30 may be moved by the shifting mechanism 33 to adjust its position in response to control by the control section 10.

Next, a position of the air blower 50 is adjusted. As a result of the adjustment, the air blower 50 is disposed so that the air vent 51 blows air from below the wafer member 5 to the outer edge of the wafer member 5 on which the light blocking material 32 is applied in the direction from the center side to the edge side of the mount plate 22. The air blower 50 may be disposed in a position determined based on actual positions of the wafer member 5 and the light-blocking-material supplier 30 in the process described above or may be disposed in a position predetermined in consideration of positions of the wafer member 5 and the light-blocking-material supplier 30. If the air blower 50 is disposed in a position determined in the process described above based on the positions of the wafer member 5 and the light-blocking-material supplier 30, the position of the air blower 50 may be determined as follows: by checking respective position information on the wafer member 5 and the light-blocking-material supplier 30 by using a camera or the like not illustrated in the drawing, supplying the position information to the control section 10 and determining the position of the air blower 50 at the control section 10 based on the supplied position information. By determining the position of the air blower 50 based on position information on actual positions of the wafer member 5 and the light-blocking-material supplier 30, the air blower 50 can be more properly disposed in relation to the wafer member 5 and the light-blocking-material supplier 30, in comparison with the case where the air blower 50 is disposed in a position predetermined in consideration of positions of the wafer member 5 and the light-blocking-material supplier 30.

Next, like the first embodiment, the light-blocking-material supplier 30 supplies the light blocking material 32 and the light blocking material 32 is applied so as to cover at least a part of the negative photoresist from the upper surface to the side surface of the negative photoresist near the outer edge of the wafer member 5. At this time, air is blown through the air vent 51 from below the wafer member 5 to the outer edge of the wafer member 5 on which the light blocking material 32 is applied, in the direction from the center side to the edge part of the mount plate 22. As a result, as illustrated in FIG. 10, air from the air vent 51 blows off the light blocking material 32*a* which drips down along the side surface of the wafer member 5 outside the mount plate 22, i.e., in a direction opposite to the center side of the mount plate 22. Thus, it is possible to reduce probability that the light blocking material 32*a* which drips down along the side surface of the wafer member 5 reaches the back surface of the wafer member 5 due to surface tension or the like. If the mount plate 22 rotates and the light-blocking-material supplier 30 continuously supplies the light blocking material 32 to the outer edge of the wafer member 5, air may be continuously blown. If the light-blocking-material supplier 30 intermittently supplies the light blocking material 32, air may be blown simultaneously when the light blocking material 32 is supplied from the light-blocking-material supplier 30 to the outer edge of the wafer member 5. Air emitted through the air vent 51 has an air pressure of 0.04 MPa, for example, and it is preferable that the air pressure be within a range from 0.04 to 0.06 MPa.

After the light blocking material 32 is applied on the wafer member 5, the light blocking material 32 is hardened. The light blocking material 32 may be a material which is capable of natural drying. If such a material is used, it is allowed not to perform the hardening process.

As described above, the semiconductor device manufacturing method according to the second embodiment includes the air blower 50 for blowing air in the direction from the center side to the edge side of the mount plate 22; the process of mounting the wafer member 5 on the mount plate 22 so that the outer edge of the wafer member 5 protrudes outward from the edge part of the mount plate 22; and the process of applying the light blocking material 32 so as to cover from the upper surface to the side surface of the negative photoresist 3 near the outer edge of the wafer member 5, the applying process including blowing air from below the wafer member 5 to the outer edge of the wafer member 5 on which the light blocking material 32 is applied in the direction from the center side to the edge side of the mount plate 22. Thus, the light blocking material 32*a* which drips down along the side surface of the wafer member 5 is blown off outside of the mount plate 22, i.e., in the direction opposite to the center side of the mount plate 22, and it is possible to further reduce probability that the light blocking material 32 reaches the back surface of the wafer member 5 due to surface tension or the like in comparison with the first embodiment. Thus, it is possible to reduce probability of a problem expected when the light blocking material reaches the back surface of the wafer member and the wafer member is placed on a mount plate of an exposure device, i.e., probability that the exposure light is not focused on the negative photoresist in the succeeding exposing process. Therefore, it is possible to improve yield rate in manufacturing semiconductor devices according to the semiconductor device manufacturing method of the present invention.

The semiconductor device manufacturing apparatus according to the second embodiment includes the wafer mount table unit 20 having the mount plate 22 on which a wafer member 5 is placed. A first line 24 represented by the dotted arrow which is a longest line among lines passing through the center of mass 23 of the mount plate 22 and each connecting two ends of the mount plate 22, is shorter than a diameter (i.e., a second line 6) of the wafer 1 (or the wafer member 5) which is placed on the mount plate 22, and the air blower 50 for blowing air in the direction from the center side to the edge side of the mount plate 22. Accordingly, in the process of applying the light blocking material 32 so as to cover from the upper surface to the side surface of the negative photoresist 3 near the outer edge of the wafer member 5 which is placed on the mount plate 22 so that the wafer member 5 protrudes outward from the edge part of the mount plate 22, air is blown from below the wafer member 5 to the outer edge of the wafer member 5 on which the light blocking material 32 is applied in the direction from the center side to the edge side of the mount plate 22; the light blocking material 32*a* which drips down along the side surface of the wafer member 5 is blown off outside of the mount plate 22, i.e., in the direction opposite to the center side of the mount plate 22; and it is possible to further reduce probability that the light blocking material 32 reaches the back surface of the wafer member 5 due to surface tension or the like in comparison with the first embodiment. Thus, it is possible to reduce probability of a problem expected when the light blocking material reaches the back surface of the wafer member 5 and the wafer member 5 is placed on a mount plate of an exposure device, i.e., probability that the exposure light is not focused on the negative photoresist in the succeeding exposing process. Therefore, it is possible to improve yield rate in manufacturing semiconductor devices according to the semiconductor device manufacturing method according to the present invention.

Third Embodiment

Figure 11:
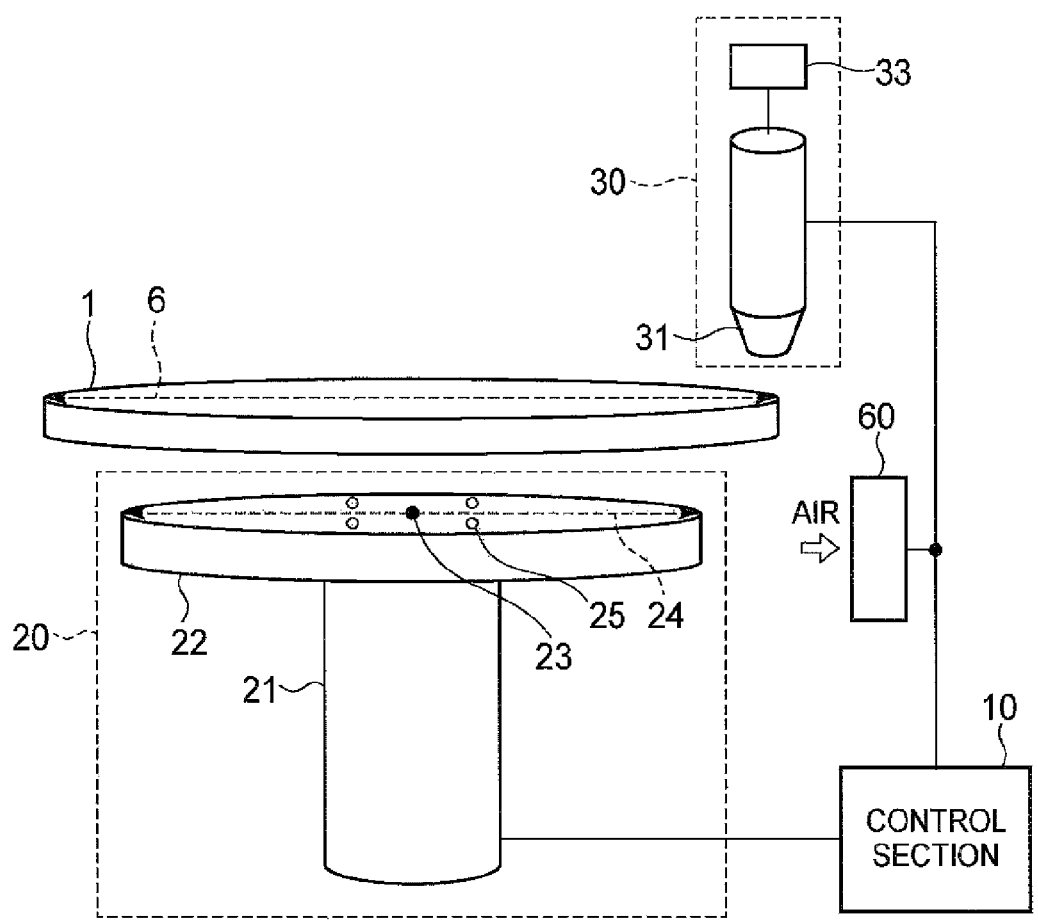
FIG. 11 is a perspective view schematically illustrating a semiconductor device manufacturing apparatus according to a third embodiment of the present invention.

FIG. 11 is a perspective view schematically illustrating a semiconductor device manufacturing apparatus according to a third embodiment of the present invention.

The semiconductor device manufacturing apparatus according to the third embodiment includes the wafer mount table unit 20 having the mount plate 22 on which a wafer member 5 is placed. A first line 24 represented by a dotted arrow on the mount plate 22 is a longest line among lines passing through a center of mass 23 of the mount plate 22 on a surface of the mount plate 22 and each connecting two ends of the mount plate 22. The first line 24 is shorter than a diameter (i.e., a second line 6 represented by a dotted arrow) of the wafer 1 (or the wafer member 5) which is placed on the mount plate 22. The semiconductor device manufacturing apparatus according to the third embodiment further includes an air sucker 60 for sucking air and having an air suck vent which may be disposed in a plane coinciding with a surface of the mount plate 22 and be disposed apart from the mount plate 22. Elements in the third embodiment that are the same as or substantially the same as those in the first embodiment are assigned the same reference characters.

The air sucker 60 has the air suck vent not illustrated in the drawing and is capable of sucking air through the air suck vent. The air sucker 60 may have a mechanism for shifting itself according to positional information on the wafer member 5 on the mount plate 22 and positional information on the light-blocking-material supplier 30. The air sucker 60 may be driven by the control section 10. The control section 10 may control the air sucker 60 so that the air suck vent is disposed in the plane coinciding with the surface of the mount plate 22 and faces the mount plate 22. The air sucker 60 may be configured so that its air sucking force can be adjusted. If the air sucker 60 is not configured to be driven by the control section, the air suck vent is disposed apart from the mount plate 22 and in the plane coinciding with the surface of the mount plate 22 and the air suck vent faces the mount plate 22.

Figure 12:
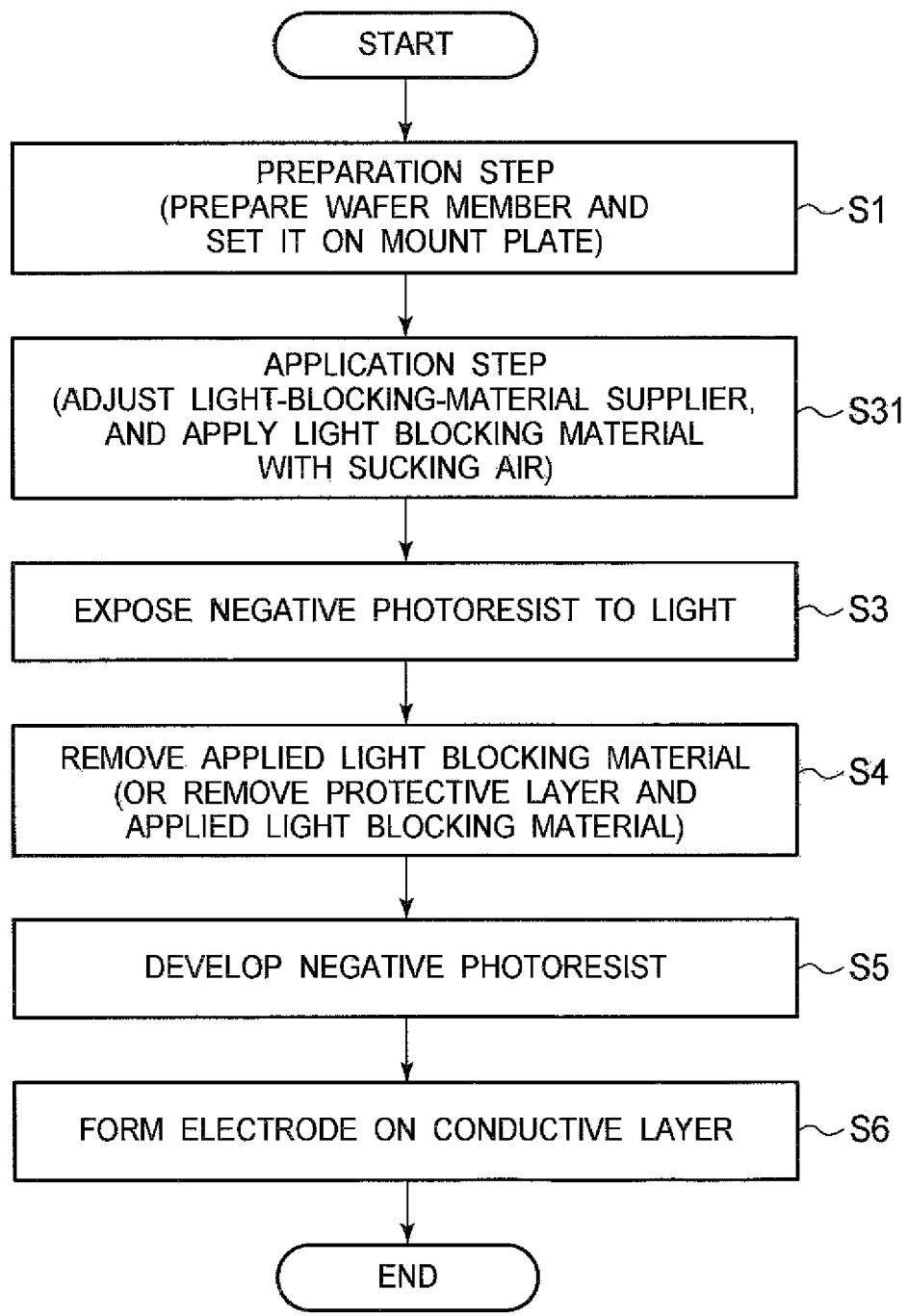
FIG. 12 is a flowchart showing a method of manufacturing a semiconductor device according to the third embodiment.

Next, referring to FIG. 12 and FIG. 13, a semiconductor device manufacturing method according to the third embodiment will be explained. Elements in the third embodiment that are the same as or substantially the same as those in the first embodiment are assigned the same reference characters. FIG. 12 is a flowchart showing a method of manufacturing a semiconductor device according to the second embodiment.

The semiconductor device manufacturing method according to the third embodiment is carried out by using the semiconductor device manufacturing apparatus which includes the wafer mount table unit 20 having the mount plate 22 on which the wafer member 5 is placed. A first line 24 represented by the dotted line on the mount plate 22 is a longest line among lines passing through the center of mass 23 on the mount plate 22 and each connecting two ends of the mount plate. The first line 24 is shorter than a diameter (i.e., a second line 6) of the wafer member 5 which is placed on the mount plate 22.

The semiconductor device manufacturing method according to the third embodiment includes the following processes: preparing the wafer member 5 as the wafer member in which the conductive layer 2 is formed on the surface of the wafer 1 and then the negative photoresist 3 is formed thereon (step S1); mounting the wafer member 5 on the mount plate 22 so that the outer edge of the wafer member 5 protrudes outward from the edge part of the mount plate 22 (step S1); applying the light blocking material 32 so as to cover at least a part from the upper surface to the side surface of the negative photoresist 3 near the outer edge of the wafer member 5 (step S31); exposing the negative photoresist 3 to light (step S3); removing the light blocking material 32 (step S4); and developing the negative photoresist 3 (step S5). In the process of applying the light blocking material 32 on the wafer member 5, air which flows from the center side to the edge side of the mount plate 22 is blown from below the wafer member 5 to the outer edge of the wafer member 5 on which the light blocking material 32 is applied (step S22). The semiconductor device manufacturing method according to the third embodiment may include a process of forming an electrode used for metal plating on the conductive layer near the outer edge of the wafer member 5 (step S4).

Figure 13:
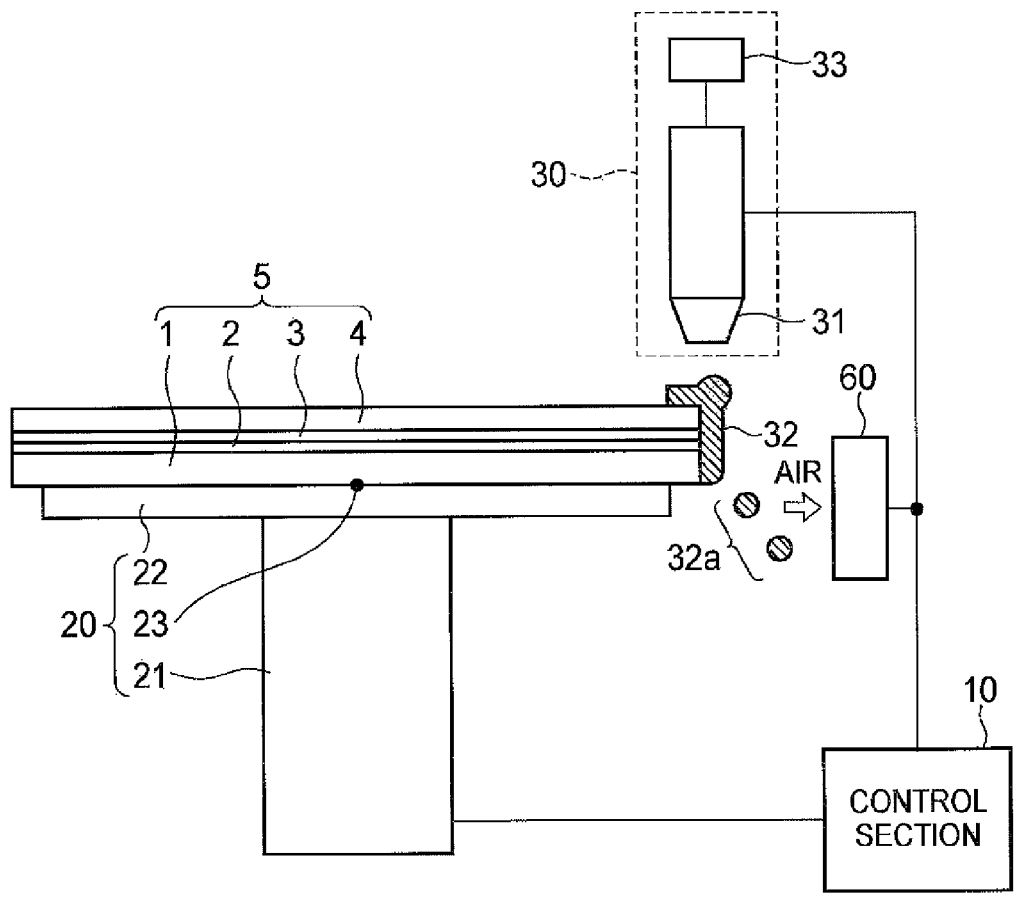
FIG. 13 is a cross-sectional view illustrating a state where a light blocking material is supplied from a light-blocking-material supplier to a wafer member and an air sucker for sucking air surrounding an outer edge of the wafer member in the third embodiment.

FIG. 13 is a cross-sectional view schematically illustrating a state where a light blocking material 32 is supplied from a light-blocking-material supplier 30 to the wafer member 5 and air surrounding the outer edge of the wafer member 5 is drawn by the sir sucker 60 in the third embodiment.

First, like the semiconductor device manufacturing method according to the third embodiment, the wafer member 5 is placed on the mount plate 22, a position of the wafer member 5 is adjusted, and the wafer member 5 is fixed to the mount plate 22 by adsorbing, for example. The light-blocking-material supplier 30 may have a shifting mechanism 33 for shifting light-blocking-material supplier 30 and changing a position to which the light blocking material is applied. The light-blocking-material supplier 30 may be moved by the shifting mechanism 33 to adjust its position in response to control by the control section 10.

Next, a position of the air sucker 60 is adjusted. As a result of the adjustment, the air sucker 60 is disposed so that the air suck vent is disposed in a position coinciding with a surface of the mount plate 22 and be disposed apart from the mount plate 22. The air sucker 60 may suck air surrounding the outer edge of the wafer member on which the light blocking material 32 is applied through the air suck vent. The position where the air suck vent may suck air surrounding the outer edge of the wafer member is a position where a path of the light blocking material 32a which drips down along the side surface of the wafer member 5 may be considerably drawn closer to the air sucker 60 as a result of the sucking by the air sucker 60 in the process of applying the light blocking material 32 on the outer edge of the wafer member 5 which will be described below. The air sucker 60 may be disposed in a position determined based on actual positions of the wafer member 5 and the light-blocking-material supplier 30 in the process described above, or may be disposed in a position predetermined in consideration of positions of the wafer member 5 and the light-blocking-material supplier 30. If the air sucker 60 is disposed in a position determined in the process described above based on positions of the wafer member 5 and the light-blocking-material supplier 30, a position of the air sucker 60 may be determined as follows: by checking respective position information on the wafer member 5 and the light-blocking-material supplier 30 by using a camera or the like not illustrated in the drawing, supplying the position information to the control section 10 and determining the position of the air sucker 60 at the control section 10 based on the supplied position information. By determining the position of the air sucker 60 based on position information on actual positions of the wafer member 5 and the light-blocking-material supplier 30, the air sucker 60 may be more properly disposed in relation to the wafer and the light-blocking-material supplier 30, in comparison with the case where the light-blocking-material supplier 30 is disposed in a position predetermined in consideration of positions of the wafer member 5 and the light-blocking-material supplier 30.

Next, like the first embodiment, the light-blocking-material supplier 30 supplies the light blocking material 32 and the light blocking material 32 is applied so as to cover from the upper surface to the side surface of the negative photoresist near the outer edge of the wafer member 5. At this time, the air sucker 60 sucks air through the air suck vent. The air sucker 60 sucks air surrounding the outer edge of the wafer member 5 on which the light blocking material 32 is applied, from the position apart from the mount plate 22 and in the plane coinciding with the surface of the mount plate 22. As a result, as illustrated in FIG. 13, the light blocking material 32a drips down along the side surface of the wafer member 5 toward the air sucker 60 in the ground direction. Thus, it is possible to reduce probability that the light blocking material 32a which drips down along the side surface of the wafer member 5 reaches the back surface of the wafer member 5 due to surface tension or the like. If the mount plate 22 rotates and the light-blocking-material supplier 30 continuously supplies the light blocking material 32 to the outer edge of the wafer member 5, the air sucker 60 continuously sucks air. If the light blocking material 32 is intermittently supplied, the air sucker 60 may suck air simultaneously when the light-blocking-material supplier 30 supplies the light blocking material 32 to the outer edge of the wafer member 5.

After the light blocking material 32 is applied to the wafer member 5, the light blocking material 32 is hardened. The light blocking material 32 may be a material which is capable of natural drying. If such a material is used, it is allowed not to perform the hardening process.

As described above, the semiconductor device manufacturing method according to the third embodiment includes the process of mounting the wafer member 5 on the mount plate 22 so that the outer edge of the wafer member 5 protrudes outward from the edge part of the mount plate 22 and the process of applying the light blocking material 32 so as to cover a part of the negative photoresist 3 from the upper surface to the side surface of the negative photoresist 3 near the outer edge of the wafer member 5. The applying process includes sucking air surrounding the outer edge of the wafer member on which the light blocking material 32 is applied, from the position apart from the mount plate 22 and in the plane in which the mount plate 22 is disposed. Accordingly, the light blocking material 32a drips down along the side surface of the wafer member 5 toward the air sucker 60 in the ground direction, and it is possible to further reduce probability that the light blocking material 32 reaches the back surface of the wafer member 5 due to surface tension or the like in comparison with the first embodiment. Thus, it is possible to reduce probability of a problem expected when the light blocking material reaches the back surface of the wafer member 5 and the wafer member 5 is placed on a mount plate of an exposure device, i.e., probability that the exposure light is not focused on the negative photoresist in the succeeding exposing process. Therefore, it is possible to improve yield rate in manufacturing semiconductor devices according to the semiconductor device manufacturing method according to the third embodiment.

The semiconductor device manufacturing apparatus according to the third embodiment includes the wafer mount table unit 20 having the mount plate 22 on which a wafer member 5 is placed. A first line 24 represented by the dotted arrow is a longest line among lines passing through the center of mass 23 on the mount plate 22 and each connecting two ends of the mount plate 22, and is shorter than a diameter (i.e., a second line 6) of the wafer 1 (or the wafer member 5) which is placed on the mount plate 22. The air sucker 60 sucks air and has the air suck vent in the plane coinciding with the surface of the mount plate 22, for example. In the process of applying the light blocking material 32 so as to cover from the upper surface to the side surface of the negative photoresist 3 near the outer edge of the wafer member 5 which is placed on the mount plate 22 so that the wafer member 5 protrudes outward from the edge part of the mount plate 22, the air sucker 60 may suck air surrounding the outer edge of the wafer member on which the light blocking material 32 is applied, from the position apart from the mount plate 22 and in the plane coinciding with the surface of the mount plate 22. Accordingly, the light blocking material 32a drips down along the side surface of the wafer member 5 toward the air sucker 60 in the ground direction, and it is possible to further reduce probability that the light blocking material 32 reaches the back surface of the wafer member 5 due to surface tension or the like in comparison with the first embodiment. Thus, it is possible to reduce probability of a problem expected when the light blocking material reaches the back surface of the wafer member 5 and the wafer member 5 is placed on a mount plate of an exposure device, i.e., probability that the exposure light is not focused on the negative photoresist in the succeeding exposing process. Therefore, it is possible to improve yield rate in manufacturing semiconductor devices according to the semiconductor device manufacturing method of the third embodiment.

MODIFIED EXAMPLE

The third embodiment may be realized in combination with the second embodiment, i.e., the air blower 50 in the second embodiment and the air sucker 60 in the third embodiment may be used in a same semiconductor device manufacturing apparatus. A semiconductor device manufacturing apparatus having both of the air blower 50 and the air sucker 60 may further reduce probability of a problem expected when a light blocking material reaches a back surface of a wafer member 5 and the wafer member 5 is placed on a mount plate of an exposure device, i.e., probability that exposure light is not focused on a negative photoresist in an exposing process, in comparison with the second and third embodiments. Therefore, it is possible to further improve yield rate in manufacturing semiconductor devices.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method of forming a plating electrode on a wafer comprising:

preparing a wafer member, the wafer member including the wafer, a conductive layer formed on a surface of the wafer and a negative photoresist formed on the conductive layer;

applying a light blocking material so as to cover an outer edge of the wafer member from an upper surface of the negative photoresist corresponding to a part of the plating electrode to be formed to a side surface of the negative photoresist;

irradiating a first part of the negative photoresist with exposure light, the first part of the negative photoresist being disposed on a area including an area corresponding to the plating electrode to be formed;

removing the light blocking material from the upper surface and the side surface of the negative photoresist; and developing the negative photoresist to remove a second part of the negative photoresist corresponding to the plating electrode to be formed and to expose a part of the conductive layer, thereby forming the plating electrode.

2. The method according to claim 1, wherein the light blocking material has a band gap for absorbing the exposure light.

3. The method according to claim 2, wherein the light blocking material has the band gap for absorbing light having a wavelength range from 365 nm to 436 nm.

4. The method according to claim 1, further comprising: exposing the negative photoresist by projecting a predetermined light pattern onto the negative photoresist through a reticle pattern which has a predetermined pattern, said projecting being performed a plurality of times; and developing the negative photoresist to make the part of the conductive layer be exposed according to the reticle pattern.

5. The method according to claim 4, further comprising: plating to form an electrode on the part of the conductive layer exposed according to the reticle pattern.

6. The method according to claim 1, wherein the wafer member further includes a protective layer capable of transmitting the exposure light on a surface of the negative photoresist;

the method further comprising:

removing the protective layer after said exposing the negative photoresist and before said developing the negative photoresist.

7. The method according to claim 6, wherein said applying the light blocking material is performed so as to cover the outer edge of the wafer member from an upper surface of the protective layer corresponding to the part of the plating electrode to be formed through a side surface of the protective layer to the side surface of the negative photoresist.

8. The method according to claim 1, wherein the method is carried out by using an apparatus including a wafer mount table unit having a mount plate on which the wafer member is placed, a first line of the mount plate being a longest line among lines passing through a center of mass of the mount plate and each connecting two ends of the mount plate, the first line being shorter than a diameter of the wafer member, the method further comprising:

before said applying the light blocking material, placing the wafer member on the mount plate so that the outer edge of the wafer member protrudes outward from an edge part of the mount plate.

9. The method according to claim 8, wherein the apparatus comprises a light-blocking-material supplier for supplying the light blocking material, the light-blocking-material supplier having a shifting mechanism for changing a position to which the light blocking material is applied, the method further comprising:

before said applying the light blocking material, adjusting a position of the light-blocking-material supplier so that the light blocking material is applied so as to cover the outer edge of the wafer member from the upper surface of the negative photoresist corresponding to the part of the plating electrode to be formed to the side surface of the negative photoresist.

10. The method according to claim 9, wherein the position of the light-blocking-material supplier is determined according to positional information on the wafer member which is placed on the mount plate.

11. The method according to claim 8, wherein the apparatus comprises an air blower for blowing air, in said applying the light blocking material, the air blower blows air so as to flow air from a center side to the edge side of the mount plate under the wafer member.

12. The method according to claim 11, wherein the air blower is capable of shifting according to positional information on the wafer member on the mount plate and positional information on the light-blocking-material supplier.

13. The method according to claim 8, wherein the apparatus comprises an air sucker for sucking air through an air suck vent, the air sucker having the air suck vent disposed in a plane coinciding with a surface of the mount plate and being disposed apart from the mount plate;

in said applying the light blocking material, the air sucker sucks air surrounding the outer edge of the wafer member.

* * * * *